United States Patent
Nunome et al.

(10) Patent No.: US 11,961,752 B2
(45) Date of Patent: Apr. 16, 2024

(54) LID OPENING-AND-CLOSING DEVICE

(71) Applicant: Murata Machinery, Ltd., Kyoto (JP)

(72) Inventors: Ryoma Nunome, Inuyama (JP); Akifumi Sakamoto, Inuyama (JP); Ryota Yamazaki, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 482 days.

(21) Appl. No.: 17/432,134

(22) PCT Filed: Jan. 20, 2020

(86) PCT No.: PCT/JP2020/001661
§ 371 (c)(1),
(2) Date: Aug. 19, 2021

(87) PCT Pub. No.: WO2020/170671
PCT Pub. Date: Aug. 27, 2020

(65) Prior Publication Data
US 2022/0172974 A1    Jun. 2, 2022

(30) Foreign Application Priority Data

Feb. 22, 2019   (JP) ................. 2019-030399

(51) Int. Cl.
*H01L 21/677*    (2006.01)
*H01L 21/673*    (2006.01)

(52) U.S. Cl.
CPC .. *H01L 21/67772* (2013.01); *H01L 21/67359* (2013.01)

(58) Field of Classification Search
CPC ......... H01L 21/67772; H01L 21/67359; H01L 21/6735; H01L 21/67363; H01L 21/67373; B65G 1/10; G03F 1/66
(Continued)

(56) References Cited

U.S. PATENT DOCUMENTS 4,422,547 A * 12/1983 Abe ................ G03F 7/70741
312/61
5,314,068 A    5/1994 Nakazato et al.
(Continued)

FOREIGN PATENT DOCUMENTS

JP    H05-175321 A    7/1993
JP    3089590 B2    9/2000
(Continued)

*Primary Examiner* — Rafael A Ortiz
(74) *Attorney, Agent, or Firm* — DLA Piper LLP (US)

(57) ABSTRACT

A first lid opening-and-closing mechanism includes: a first holder that holds an upper lid of a first container; a first protrusion provided to protrude from the first holder toward one side direction with respect to the first holder and extends to outside of a casing; and a first raising/lowering driver that raises and lowers the first holder in a cantilevered manner with the first protrusion interposed therebetween. A second lid opening-and-closing mechanism includes: a second holder that holds an upper lid of a second container; a second protrusion provided to protrude from the second holder toward the one side direction and extends to the outside of the casing; and a second raising/lowering driver that raises and lowers the second holder in a cantilevered manner with the second protrusion interposed therebetween. The first raising/lowering driver and the second raising/lowering driver are located outside the casing in the one side direction.

5 Claims, 12 Drawing Sheets

(58) Field of Classification Search
USPC .................. 206/723, 1.5, 832; 414/266, 282
See application file for complete search history.

(56) References Cited

U.S. PATENT DOCUMENTS

| | | | | |
|---|---|---|---|---|
| 5,743,409 | A * | 4/1998 | Nakahara | .......... H01L 21/67386 |
| | | | | 206/719 |
| 2002/0021435 | A1 | 2/2002 | Yamada | |
| 2002/0064439 | A1 | 5/2002 | Otaguro | |
| 2004/0076496 | A1 * | 4/2004 | Elliott | ............... H01L 21/67373 |
| | | | | 414/217 |
| 2009/0035098 | A1 * | 2/2009 | Igarashi | ............ H01L 21/67373 |
| | | | | 414/217 |

FOREIGN PATENT DOCUMENTS

| | | | |
|---|---|---|---|
| JP | 2002-009133 A | | 1/2002 |
| JP | 2002-170860 A | | 6/2002 |
| JP | 2007-141924 A | | 6/2007 |
| JP | 2015-093696 A | | 5/2015 |
| KR | 20100021150 A | * | 2/2010 |

* cited by examiner

LID OPENING-AND-CLOSING DEVICE

TECHNICAL FIELD

This disclosure relates to a lid opening-and-closing device.

BACKGROUND

In a semiconductor manufacturing factory, for example, an article such as a reticle is conveyed to a storage device, a semiconductor manufacturing device or the like while being accommodated in a container such as a reticle pod, and the reticle, for example, is retrieved from the container in the storage device or the like. The container includes a container body on which an article is placed and an upper lid, for example. The above-described storage device or the like includes a lid opening-and-closing device that opens and closes the upper lid of the container. As such a lid opening-and-closing device, a configuration is known that includes a holder that holds an upper lid, and a raising/lowering driver that raises and lowers the holder, the configuration allowing the raising/lowering driver to raise and lower the holder, thereby opening and closing the upper lid (see Japanese Patent No. 3089590, for example).

In a lid opening-and-closing device described in JP '590, for a plurality of containers disposed one above another, a plurality of holders, each of which holds the upper lid of the corresponding container to raise and lower the upper lid, are disposed in a manner aligned in the up-and-down direction, and these holders are raised and lowered by a single raising/lowering driver including a motor and a ball screw. In that configuration, because the single raising/lowering driver is used, the efficiency of opening and closing each container is low. A configuration simply using a plurality of raising/lowering drivers has a problem of increasing size of the lid opening-and-closing device. Furthermore, because the raising/lowering driver acts as a source of particles, if the raising/lowering drivers are disposed in a manner scattered around the containers, it is difficult to maintain a clean environment around the containers.

It could therefore be helpful to provide a lid opening-and-closing device that can suppress upsizing of the device while using a plurality of raising/lowering drivers and easily maintain a clean environment around containers.

SUMMARY

We thus provide:

A lid opening-and-closing device includes: a casing; a first lid opening-and-closing mechanism that opens and closes an upper lid of a first container disposed in the casing; and a second lid opening-and-closing mechanism that opens and closes an upper lid of a second container disposed in parallel below the first container in the casing. The first lid opening-and-closing mechanism includes: a first holder that holds the upper lid of the first container; a first protrusion provided to protrude from the first holder toward one side direction with respect to the first holder and extends to outside of the casing; and a first raising/lowering driver that raises and lowers the first holder in a cantilevered manner with the first protrusion interposed therebetween. The second lid opening-and-closing mechanism includes: a second holder that holds the upper lid of the second container, a second protrusion provided to protrude from the second holder toward the aforesaid one side direction and extends to the outside of the casing; and a second raising/lowering driver that raises and lowers the second holder in a cantilevered manner with the second protrusion interposed therebetween. The first raising/lowering driver and the second raising/lowering driver are located outside the casing and in the aforesaid one side direction with respect to the casing.

The first raising/lowering driver and the second raising/lowering driver may be disposed adjacent to each other. The casing may be disposed in an environment where an air flow is present, and the aforesaid one side direction may be downstream of the air flow with respect to the casing. Each of the first raising/lowering driver and the second raising/lowering driver may be a fluid-pressure cylinder including a cylinder body and a cylinder rod, the first raising/lowering driver may be disposed such that the corresponding cylinder rod protrudes upward, the second raising/lowering driver may be disposed such that the corresponding cylinder rod protrudes downward, and the cylinder body of the first raising/lowering driver and the cylinder body of the second raising/lowering driver may be disposed to overlap each other at least partially when viewed in a horizontal direction.

An attachment may be provided to protrude from the casing toward the aforesaid one side direction, the first raising/lowering driver may be attached to one surface of the attachment, and the second raising/lowering driver may be attached to another surface of the attachment that is opposite to the one surface.

With the lid opening-and-closing device described above, the first holder and the second holder with the upper lids of the containers are raised and lowered by the first raising/lowering driver and the second raising/lowering driver, respectively, and thus articles can be efficiently brought into or out from the containers. Because the first raising/lowering driver and the second raising/lowering driver respectively hold the first holder and the second holder in a cantilevered manner and are located outside the casing collectively in the aforesaid one side direction with respect to the casing, the first raising/lowering driver and the second raising/lowering driver can be disposed compactly, and upsizing of the device can be suppressed. Furthermore, because the first raising/lowering driver and the second raising/lowering driver that act as sources of particles are disposed collectively, a clean environment around the containers can be easily maintained by discharging gas in an area where the first raising/lowering driver and the second raising/lowering driver are disposed.

In the configuration in which the first raising/lowering driver and the second raising/lowering driver are disposed adjacent to each other, the first raising/lowering driver and the second raising/lowering driver can be disposed more compactly. In the configuration in which the casing is disposed in an environment where an air flow is present and the aforesaid one side direction is downstream of the air flow with respect to the casing, particles generated in the first raising/lowering driver and the second raising/lowering driver can be prevented from entering the casing, and contamination around the containers in the casing can be avoided. In the configuration in which each of the first raising/lowering driver and the second raising/lowering driver is a fluid-pressure cylinder including a cylinder body and a cylinder rod, the first raising/lowering driver is disposed such that the corresponding cylinder rod protrudes upward, the second raising/lowering driver is disposed such that the corresponding cylinder rod protrudes downward, and the cylinder body of the first raising/lowering driver and the cylinder body of the second raising/lowering driver are disposed to overlap each other at least partially when viewed in the horizontal direction, the first raising/lowering driver and the second raising/lowering driver can be disposed compactly in the up-and-down direction while raising and lowering of the first holder and the second holder can be performed reliably by using the fluid-pressure cylinders. In the configuration in which the attachment is provided to protrude from the casing toward the aforesaid one side direction, the first raising/lowering driver is attached to one surface of the attachment, and the second raising/lowering driver is attached to the other surface of the attachment that is opposite to the one surface, the first raising/lowering driver and the second raising/lowering driver can be disposed in one location collectively with the attachment interposed therebetween.

DESCRIPTION OF REFERENCE SIGNS

Figure 1:
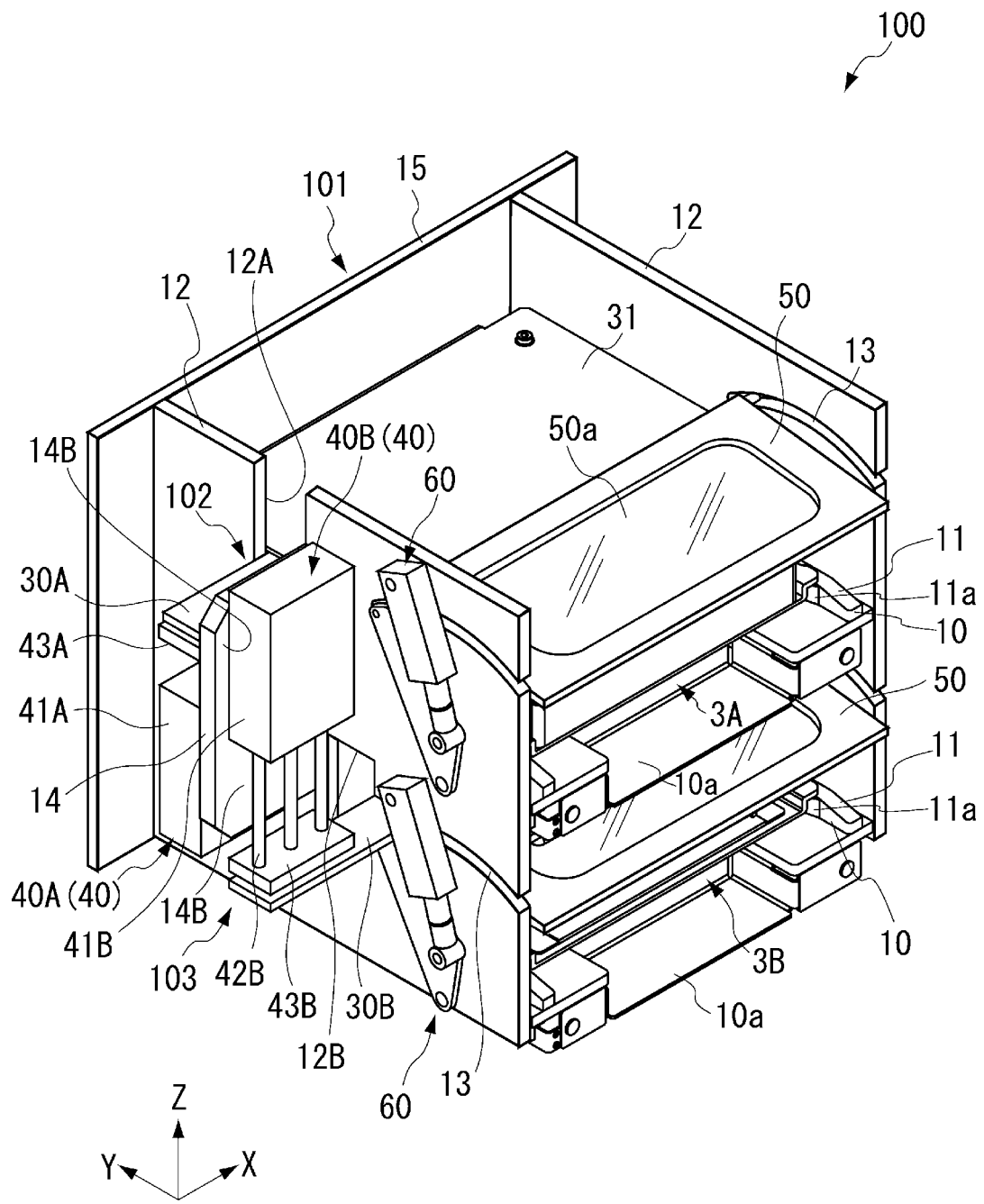
FIG. 1 is a perspective view illustrating one example of a lid opening-and-closing device.

R reticle
AR air
1 container body
2 upper lid
3A first container
3B second container
4 locking mechanism
10 placement platform
14 attachment
14A first surface
14B second surface
20 holder
20A first holder
20B second holder
21 lower guider
24 upper guider
30 protrusion
30A first protrusion
30B second protrusion
40 raising/lowering driver
40A first raising/lowering driver
40B second raising/lowering driver
41A, 41B cylinder body
42A, 42B cylinder rod
43A, 43B movable member
50 shutter
60 shutter drive
100 lid opening-and-closing device
101 casing
102 first lid opening-and-closing mechanism
103 second lid opening-and-closing mechanism
200 reticle loading-and-unloading device
202 fan filter unit (FFU)
204 reticle conveyor

DETAILED DESCRIPTION

An example will now be described with reference to the drawings. It should be noted that our devices are not limited to the example described below. In the drawings, to describe the example, the scale is changed to be expressed as appropriate by, for example, illustrating a part in an enlarged or emphasized manner. In each drawing, directions in the drawing are illustrated with the XYZ-coordinate system. In this XYZ-coordinate system, the up-and-down direction (vertical direction) is defined as a Z direction, and horizontal directions are defined as an X direction and a Y direction. The Y direction is one direction in the horizontal directions, and is a direction in which a container described later is inserted. The X direction is a direction orthogonal to the Y direction. In each direction of the X, Y, Z directions, appropriately, the orientation indicated by each arrow is expressed as a +direction (e.g., +X direction), and the direction opposite to the orientation indicated by the arrow is expressed as a − direction (e.g., −X direction).

Figure 2:
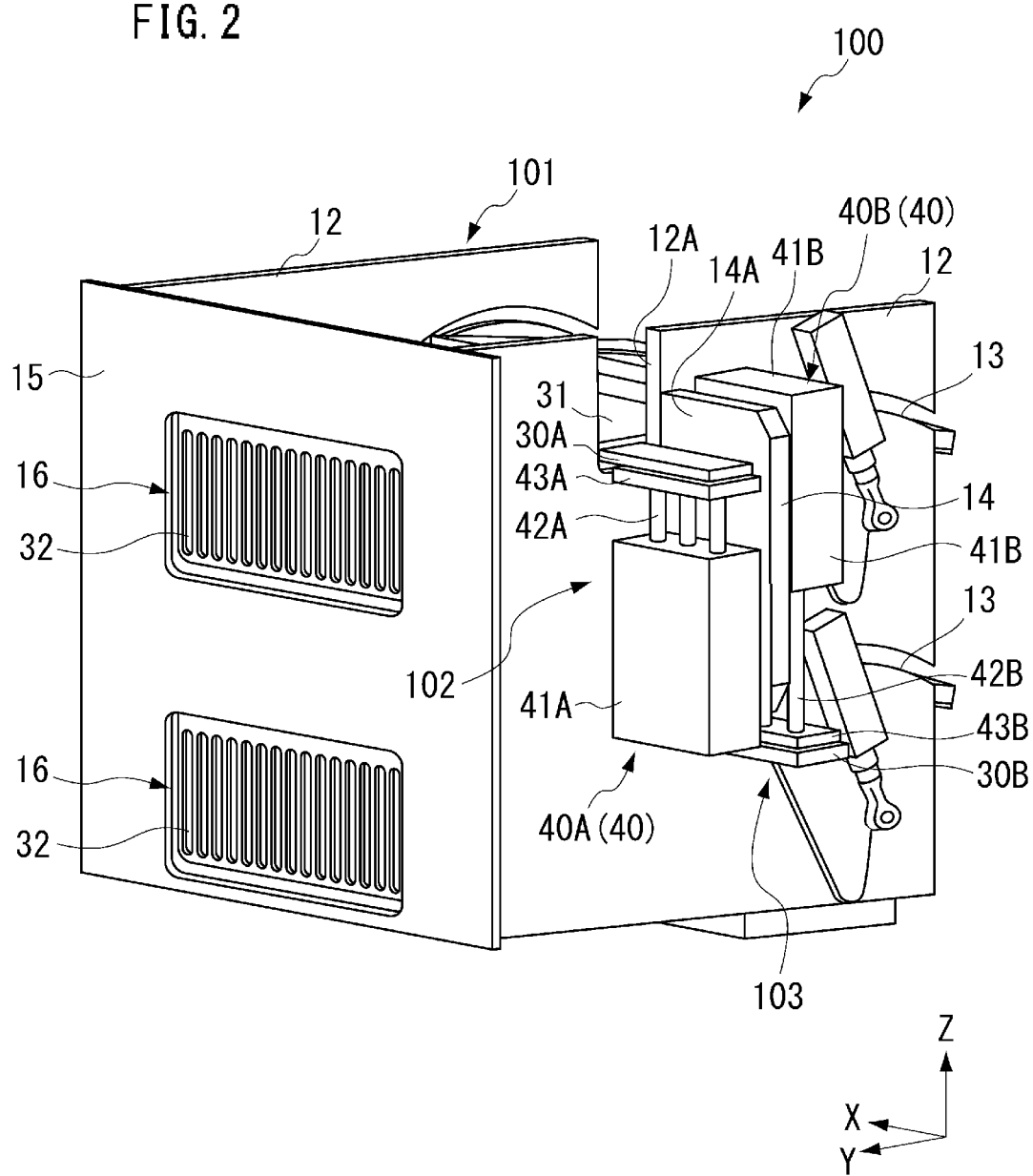
FIG. 2 is a perspective view of the lid opening-and-closing device in FIG. 1 when viewed obliquely from rear and above.
Figure 3:
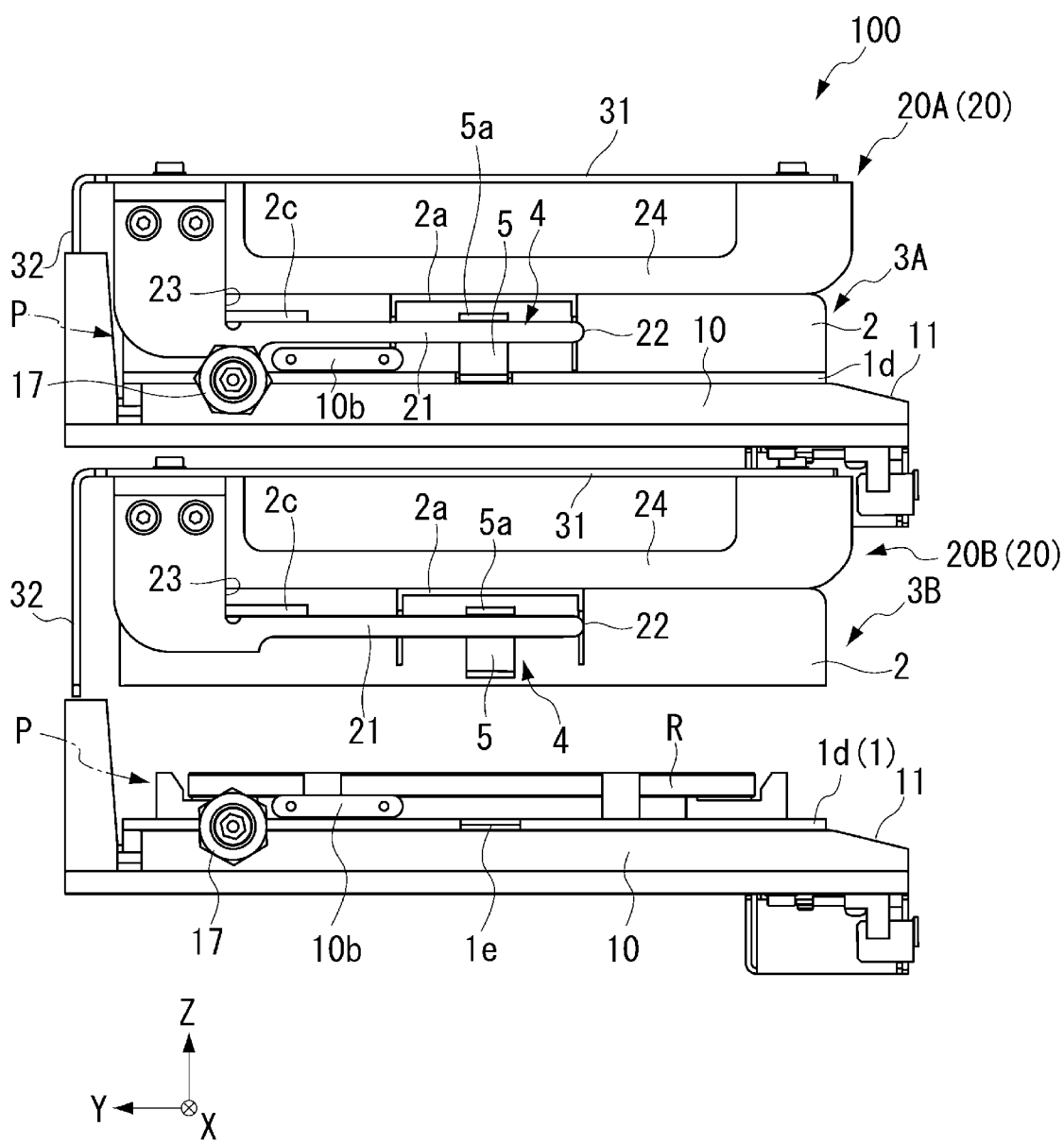
FIG. 3 is a diagram of the lid opening-and-closing device when viewed from an −X side.

FIG. 1 is a perspective view illustrating one example of a lid opening-and-closing device 100. FIG. 2 is a perspective view of the lid opening-and-closing device 100 when viewed obliquely from rear and above. FIG. 3 is a diagram of the lid opening-and-closing device 100 when viewed from the −X side. In FIG. 3, a casing 101 described later is omitted. The lid opening-and-closing device 100 illustrated in FIGS. 1 to 3 includes a first container 3A and a second container 3B, each of which includes a container body 1 and an upper lid 2 and accommodates an article such as a reticle R, and opens and closes the respective upper lids 2 therein.

Figure 4:
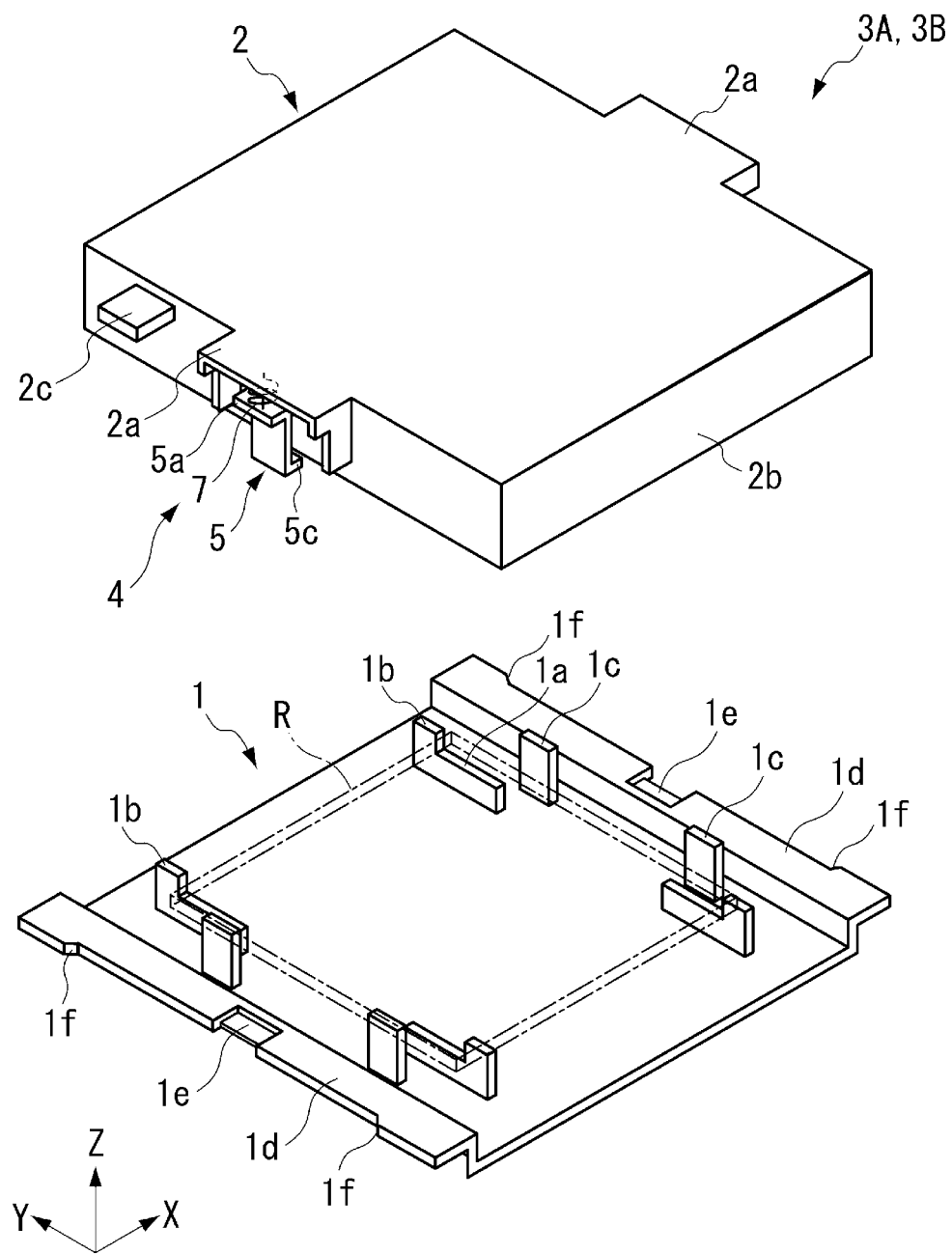
FIG. 4 is an exploded perspective view illustrating one example of a container.

The first container 3A and the second container 3B each include a locking mechanism 4 that locks the corresponding upper lid 2 onto the corresponding container body 1 when the upper lid 2 is mounted on the container body 1 (see FIG. 4). The first container 3A and the second container 3B are reticle pods that accommodate reticles R as articles. Each locking mechanism 4 has a configuration in which locking is released when a strip 5a, which is provided to the corresponding upper lid 2 and extends in the horizontal direction, is rotated upward to an extent exceeding a predetermined value with respect to the corresponding container body 1. Details of the first container 3A and the second container 3B will be described later. To retrieve accommodated reticles R from the first container 3A and the second container 3B having these locking mechanisms 4, the lid opening-and-closing device 100 of this example releases the above-described locking mechanisms 4 to open and close the upper lids 2 with respect to the container bodies 1.

The lid opening-and-closing device 100 includes a casing 101, a first lid opening-and-closing mechanism 102, and a second lid opening-and-closing mechanism 103. The casing 101 includes two opposed side walls 12 and a back plate 15. Between the two side walls 12, the first lid opening-and-closing mechanism 102 and the second lid opening-and-closing mechanism 103 described above and placement platforms 10 are provided. The lid opening-and-closing device 100 illustrated in FIGS. 1 to 3 allows the placement platforms 10 provided in upper and lower two stages to have the first container 3A and the second container 3B disposed thereon in upper and lower two stages. For the placement platforms 10, specified positions P (see FIG. 3), at which the first container 3A and the second container 3B are correspondingly placed, are specified. The placement platforms 10 are each two rod-like members extending in the Y direction, and are disposed in a manner aligned parallel to each other in the X direction. The placement platforms 10 support flanges 1d of the first container 3A and the second container 3B on the +X side and flanges 1d thereof on the −X side, and the first container 3A and the second container 3B are each placed parallel to the horizontal plane.

Ends of the placement platforms 10 on the −Y side correspond to inlets through which the first container 3A and the second container 3B are inserted. The first container 3A and the second container 3B are inserted through these inlets in the +Y direction to be placed on the placement platforms 10. On the ends (inlets) of the placement platforms 10 on the −Y side, slopes 11 are formed. The slopes 11 are formed to be inclined upward (toward the +Z side) from the ends on the −Y side toward the +Y side. With the slopes 11 thus formed, the flanges 1d are guided from the slopes 11 to the placement platforms 10 when the first container 3A and the second container 3B are inserted, whereby the first container 3A and the second container 3B can be disposed at respective appropriate heights. On inner faces of the respective placement platforms 10 (faces on the +X side of the placement platforms 10 on the −X side, and faces on the −X side of the placement platforms 10 on the +X side), second slopes 11a are each formed. When the first container 3A and the second container 3B are inserted, the second slopes 11a come into contact with side portions (see FIG. 4) that are formed upright from the bottoms of the container bodies 1 to form the flanges 1d, thereby guiding the first container 3A and the second container 3B (container bodies 1) to appropriate positions in the X direction for positioning. The second slopes 11a may be formed from the ends of the respective placement platforms 10 on the −Y side.

In the casing 101, at the inlets through which the first container 3A and the second container 3B are inserted, recesses 10a each of which is a portion recessed downward between the corresponding two placement platforms 10 are formed. With these recesses 10a, for example, when the first container 3A or the second container 3B is inserted onto the corresponding placement platforms 10 by an operator or the like, or when the first container 3A or the second container 3B on the placement platforms 10 is brought out, a hand of the operator is not caught by obstacles, and consequently the first container 3A or the second container 3B can be easily carried, whereby convenience when bringing in and out the first container 3A or the second container 3B is improved. Above the placement platforms 10 on the +Y side, pressing members 10b are each provided. The pressing members 10b are disposed above upper faces of the placement platforms 10 by the thickness of the flanges 1d of the container bodies 1. When the first container 3A and the second container 3B are disposed at the respective specified positions P, the pressing members 10b are disposed on the upper faces of the flanges 1d on the placement platforms 10, thereby preventing the container bodies 1 from moving upward.

Stoppers (not illustrated) may be provided that come into contact with the container bodies 1 on the +Y side when the first container 3A or the second container 3B is disposed at the corresponding specified position P. When the first container 3A or the second container 3B is disposed at the specified position P, these stoppers may prevent the corresponding container body 1 from moving from the position toward the +Y direction, thereby positioning the container body 1 in the Y direction. The lid opening-and-closing device 100 also includes holding members 17 that prevent the first container 3A or the second container 3B disposed at the specified position P from coming out (moving toward the −Y direction). The holding members 17 are provided with their tips facing inward of the lid opening-and-closing device 100. Each holding member 17 includes a projection (not illustrated) that is elastically supported inward by an elastic member (not illustrated), for example. This projection that is made to project by the elastic member toward the −Y side of the corresponding stepped part 1f (see FIG. 4) formed on each flange 1d when the first container 3A or the second container 3B is disposed at the specified position P, thereby preventing the first container 3A or the second container 3B disposed at the specified position P from moving in the −Y direction. The holding member 17 is omitted in FIGS. 6, 7, and 9.

The side walls 12 are disposed on the +X side and the −X side of the placement platforms 10. The side walls 12 are provided integrally with the respective placement platforms 10. In this example, in the casing 101, each placement platform 10 is provided with a shutter 50 that can open and close the inlet of the first container 3A or the second container 3B and a shutter drive 60 that opens and closes the shutter 50. The shutter 50 is interposed between the two opposed side walls 12, and is provided in a manner suspended from a coupler with the shutter drive 60 (in a manner cantilevered by the coupler). Each shutter 50 is provided with a window 50a through which inside of the casing 101 can be visually checked. In each of the two side walls 12, slits 13 that correspond to tracks along which the couplers between the shutters 50 and the shutter drives 60 move are formed. Each slit 13 is formed in an arc shape protruding upward. Each shutter 50 is movable between an open position and a closed position by moving along the corresponding slits 13. The corresponding shutter drive 60 is disposed outside the side walls 12 (outside the casing 101), and moves the shutter 50 between the open position and the closed position. The shutter drives 60 are disposed outside the casing 101 on one side (on the −X side) similarly to the first lid opening-and-closing mechanism 102 and the second lid opening-and-closing mechanism 103 described later.

On the side wall 12 on the −X side, an attachment 14 protruding in the −X direction is provided. The attachment 14 has a plate-like shape, for example, and extends along the up-and-down direction (Z direction). Onto the attachment 14, raising/lowering drivers 40 (a first raising/lowering driver 40A and a second raising/lowering driver 40B) described later are partially attached. In the back plate 15 of the casing 101 on the +Y side, openings 16 are formed (see FIG. 2). The openings 16 are formed corresponding to the first container 3A and the second container 3B placed on the placement platforms 10, and are formed in two places in the up-and-down direction.

Through the openings 16, reticles R accommodated in the first container 3A and the second container 3B are retrieved, or reticles R are placed into the first container 3A and the second container 3B. Each opening 16 is formed in a size through which a reticle R and a part of a reticle conveyor 204

(see FIG. 11) that conveys the reticle R can pass. The openings 16 allow air (gas) from inside the casing 101 to pass. On the respective openings 16, slit covers 32, which are provided to the first lid opening-and-closing mechanism 102 and the second lid opening-and-closing mechanism 103, are disposed. These covers 32 are retractable from the openings 16.

The first lid opening-and-closing mechanism 102 opens and closes the upper lid 2 of the first container 3A placed at the specified position P on the corresponding placement platform 10. The second lid opening-and-closing mechanism 103 opens and closes the upper lid 2 of the second container 3B placed at the specified position P on the corresponding placement platform 10. Each of the first lid opening-and-closing mechanism 102 and the second lid opening-and-closing mechanism 103 includes a holder 20, a protrusion 30, and the corresponding raising/lowering driver 40. The holder 20, the protrusion 30, and the raising/lowering driver 40 are disposed for each of the upper and lower placement platforms 10. In this example, a first holder 20A, a first protrusion 30A, and the first raising/lowering driver 40A that are provided corresponding to the upper placement platform 10 constitute the first lid opening-and-closing mechanism 102. A second holder 20B, a second protrusion 30B, and the second raising/lowering driver 40B that are provided corresponding to the lower placement platform 10 constitute the second lid opening-and-closing mechanism 103. In the following description, when configurations of the respective components are not distinguished between the first lid opening-and-closing mechanism 102 and the second lid opening-and-closing mechanism 103, the components are simply referred to as the holder 20, the protrusion 30, and the raising/lowering driver 40.

Each holder 20 (the first holder 20A and the second holder 20B) includes lower guiders 21, upper guiders 24, and a raising/lowering member 31. The lower guiders 21 are provided above the respective placement platforms 10 on the +X side and the −X side. The lower guiders 21 are disposed along the direction in which the placement platforms 10 extend. When the first container 3A and the second container 3B are inserted in the horizontal direction to the specified positions P of the placement platforms 10, the lower guiders 21 come into contact with lower faces of strips 5a of the locking mechanisms 4 provided to the first container 3A and the second container 3B, and rotate these strips 5a upward to the extent exceeding the predetermined value with respect to the container bodies 1. With the lower faces of the strips 5a, upper faces of the lower guiders 21 come into contact.

On a tip of each lower guider 21 on the inlet side (−Y side), an inclined surface or a curved surface is formed. In this example, on the tip of the lower guider 21 on the −Y side, a curved surface 22 is formed. With the curved surfaces 22 thus formed, the strips 5a come into contact with the curved surfaces 22 when the first container 3A and the second container 3B are inserted, and thus the strips 5a can be guided appropriately onto the lower guiders 21.

An end of each lower guider 21 on the far side (+Y side) is bent upward, and is attached to the corresponding upper guider 24 described later. An upper face of the lower guider 21 on the +Y side is bent upward to form a stopper 23. The stoppers 23 are brought into contact with ends on the +Y side of respective protruding pieces 2c of the first container 3A and the second container 3B disposed at the specified positions P, thereby preventing the first container 3A and the second container 3B from further moving from the specified positions P in the +Y direction.

The upper guiders 24 are provided above the corresponding two lower guiders 21 to extend along the lower guiders 21 in the Y direction. The upper guiders 24 and the lower guiders 21 are provided in parallel. The length of the upper guiders 24 in the Y direction is greater than that of the lower guiders 21. When the first container 3A or the second container 3B is inserted in the horizontal direction to the specified position P of the corresponding placement platforms 10, the upper guiders 24 come into contact with upper faces of side portions 2a of the corresponding upper lid 2 that are opposed to each other above the corresponding strips 5a. With the upper guiders 24 thus provided, the upper lid 2 can be pressed from above when the lower guiders 21 rotate the strips 5a upward. In other words, by sandwiching each side portion 2a and the corresponding strip 5a between the corresponding upper guider 24 and the corresponding lower guider 21, upward movement of the side portion 2a (upper lid 2) is prevented by the upper guider 24 and also the strip 5a is rotated upward by the lower guider 21.

The upper guider 24 is disposed apart from the lower guider 21 by a predetermined distance L in the up-and-down direction (Z direction) (see FIG. 8). This predetermined distance L is a distance, for example, that makes it possible to sandwich the side portion 2a of the upper lid 2 and the strip 5a between the lower guider 21 and the upper guider 24, and rotate the strip 5a upward with respect to the corresponding container body 1 to an extend exceeding the predetermined value (move the end of the strip 5a upward) while preventing upward movement of the upper lid 2 by sandwiching, to release locking by the corresponding locking mechanism 4. Because a lower face of the upper guider 24 presses the upper face of the side portion 2a of the upper lid 2, upward movement of the upper lid 2 is prevented and locking by the locking mechanism 4 can be reliably released when the lower guider 21 rotates the strip 5a upward. Sandwiching the side portion 2a of the upper lid 2 and the strip 5a between the lower guider 21 and the upper guider 24 holds the upper lid 2. In other words, the first holder 20A and the second holder 20B each include the lower guiders 21 and the upper guiders 24, thereby functioning as holders for the upper lids 2. The tip of each lower guider 21 and the corresponding upper guider 24 may be connected by a bracket, for example. The lower guider 21 extends in the −Y direction from the vicinity of the corresponding stopper 23, and is provided in a cantilevered manner. Connecting the tip of the lower guider 21 and the upper guider 24 with a bracket, for example, increases the stiffness of the lower guider 21, thereby preventing the tip of the lower guider 21 from tilting down.

The upper guider 24 is attached to the corresponding plate-like raising/lowering member 31, and ascends and descends accordingly as the raising/lowering member 31 ascends and descends. The lower guider 21 attached to the upper guider 24 ascends and descends accordingly as the upper guider 24 and the raising/lowering member 31 ascend and descend. In other words, the lower guider 21 and the upper guider 24 ascend and descend integrally with the raising/lowering member 31. The raising/lowering member 31 is raised and lowered by the corresponding raising/lowering driver 40 described later. Driving the raising/lowering driver 40, for example, may be configured, for example, to be automatically performed by a control device (not illustrated) or the like when a sensor or the like has detected that the first container 3A or the second container 3B has been disposed at the corresponding specified position P, or may be configured to be performed by operation (manual operation) of a control panel (not illustrated) by an operator.

To an end of the raising/lowering member 31 on the +Y side, the corresponding slit cover 32 is provided. The cover 32 is provided in a manner bent downward from an end of the raising/lowering member 31 on the +Y side, and is disposed to extend downward from the end of the raising/lowering member 31. The cover 32 provides restriction, while reliably allowing circulation (e.g., flowing in or flowing out) of gas from inside the casing 101 so that the operator will not further put his/her hand that has already been placed in the casing 101 to an area where reticle conveyor 204 (see FIG. 11, for example) operates. The cover 32 ascends and descends integrally with the raising/lowering member 31, is disposed at a position covering the corresponding opening 16 of the casing 101 as the raising/lowering member 31 descends, and ascends together with the raising/lowering member 31 as the raising/lowering member 31 ascends, and retracts from the position covering the opening 16 (the opening 16 is opened). Thus, when the upper lid 2 is raised together with the raising/lowering member 31, a reticle R can be brought into and out from the container body 1 through the opening 16.

The first protrusion 30A is provided to the raising/lowering member 31 of the first holder 20A. This first protrusion 30A has a plate-like shape along an XY plane, and is provided to protrude from an end of the raising/lowering member 31 on the −X side toward the −X direction (one side direction with respect to the first holder 20A). The first protrusion 30A passes through the corresponding side wall 12 in the −X direction, and extends to the outside of the casing 101. The second protrusion 30B is provided to the raising/lowering member 31 of the second holder 20B. This second protrusion 30B has a plate-like shape along the XY plane, and is provided to protrude from an end of the raising/lowering member 31 on the −X side toward the −X direction, that is, the same direction as the direction in which the first protrusion 30A protrudes (one side direction with respect to the second holder 20B). The second protrusion 30B passes through the side wall 12 in the −X direction, and extends to the outside of the casing 101. The first protrusion 30A and the second protrusion 30B may have the same dimensions in the Y direction and the X direction, or may have different dimensions. The first protrusion 30A and the second protrusion 30B are disposed to be displaced from each other in the Y direction in plan view. The first protrusion 30A and the second protrusion 30B are also disposed to be displaced from each other in the Z direction.

In the side wall 12 on the −X side, a first notch 12A through which the first protrusion 30A is passed and a second notch 12B through which the second protrusion 30B is passed are formed. The first notch 12A is formed by cutting out the side wall 12 downward from an area, on the +Y side, of the upper side of the side wall 12, and the dimension (width) thereof in the Y direction is constant in the up-and-down direction. The dimension of the first notch 12A in the up-and-down direction is set to cover the range within which the first protrusion 30A ascends and descends. This first notch 12A allows the first protrusion 30A to ascend and descend along the first notch 12A.

The second notch 12B is formed by cutting out the side wall 12 downward from an approximate center of the side wall 12 in the up-and-down direction and the Y direction, and the dimension (width) thereof in the Y direction is constant in the up-and-down direction. The second notch 12B may be formed to continue to the slit 13 to open and close the corresponding shutter 50, for example. The dimension of the second notch 12B in the up-and-down direction is set to cover the range within which the second protrusion 30B ascends and descends. This second notch 12B allows the second protrusion 30B to ascend and descend along the second notch 12B.

Each raising/lowering driver 40 raises and lowers the corresponding holder 20 in a cantilevered manner with the corresponding protrusion 30 interposed therebetween. The raising/lowering driver 40 raises and lowers the holder 20 (the corresponding one of the lower guider 21 and the upper guider 24) holding the corresponding upper lid 2 with respect to the corresponding container body 1. As the raising/lowering driver 40, for example, a fluid-pressure cylinder such as an air cylinder device or an oil cylinder device is used. Among the raising/lowering drivers 40, the first raising/lowering driver 40A raises and lowers the first holder 20A. The second raising/lowering driver 40B raises and lowers the second holder 20B.

The first raising/lowering driver 40A includes a cylinder body 41A, cylinder rods 42A, and a movable member 43A. The cylinder body 41A is attached to a first surface 14A (see FIG. 2) of the attachment 14 on the +Y side protruding from the side wall 12 in the −X direction that is the same direction as a direction in which the first protrusion 30A and the second protrusion 30B protrude. The cylinder rods 42A protrude upward (in the +Z direction) from the cylinder body 41A. The cylinder rods 42A move in the up-and-down direction in accordance with the pressure of fluid that flows into or flows out from the cylinder body 41A. The movable member 43A is fixed to the upper ends (ends on the +Z side) of the cylinder rods 42A. The movable member 43A is fixed to the first protrusion 30A of the first holder 20A.

When the movable member 43A (cylinder rods 42A) moves in the up-and-down direction, the first holder 20A is accordingly raised and lowered with the first protrusion 30A interposed therebetween. This first raising/lowering driver 40A raises the first holder 20A by causing the cylinder rods 42A to move upward (protrude) from the cylinder body 41A, and lowers the first holder 20A by causing the cylinder rods 42A to move downward (retract) into the cylinder body 41A.

The second raising/lowering driver 40B is disposed adjacent to the first raising/lowering driver 40A in the Y direction. The second raising/lowering driver 40B includes a cylinder body 41B, cylinder rods 42B, and a movable member 43B. The cylinder body 41B is attached to a second surface 14B (see FIG. 1) of the attachment 14 on the −Y side. The cylinder rods 42B protrude downward (in the −Z direction) from the cylinder body 41B. The cylinder rods 42B move in the up-and-down direction in accordance with the pressure of fluid that flows into or flows out from the cylinder body 41B. The movable member 43B is fixed to the lower ends (ends on the −Z side) of the cylinder rods 42B. The movable member 43B is fixed to the second protrusion 30B of the second holder 20B.

When the movable member 43B (cylinder rods 42B) moves in the up-and-down direction, the second holder 20B is accordingly raised and lowered with the second protrusion 30B interposed therebetween. This second raising/lowering driver 40B raises the second holder 20B by retracting the cylinder rods 42B with respect to the cylinder body 41B, and lowers the second holder 20B by extending the cylinder rods 42B with respect to the cylinder body 41B.

An upper part of the cylinder body 41A of the first raising/lowering driver 40A and a lower part of the cylinder body 41B of the second raising/lowering driver 40B are disposed to overlap each other when viewed in the horizontal direction (Y direction). In other words, the cylinder body 41A of the first raising/lowering driver 40A and the cylinder body 41B of the second raising/lowering driver 40B overlap each other at least partially when viewed in the horizontal direction (Y direction). Thus, the first raising/lowering driver 40A and the second raising/lowering driver 40B can be disposed compactly in the up-and-down direction.

Figure 5A:
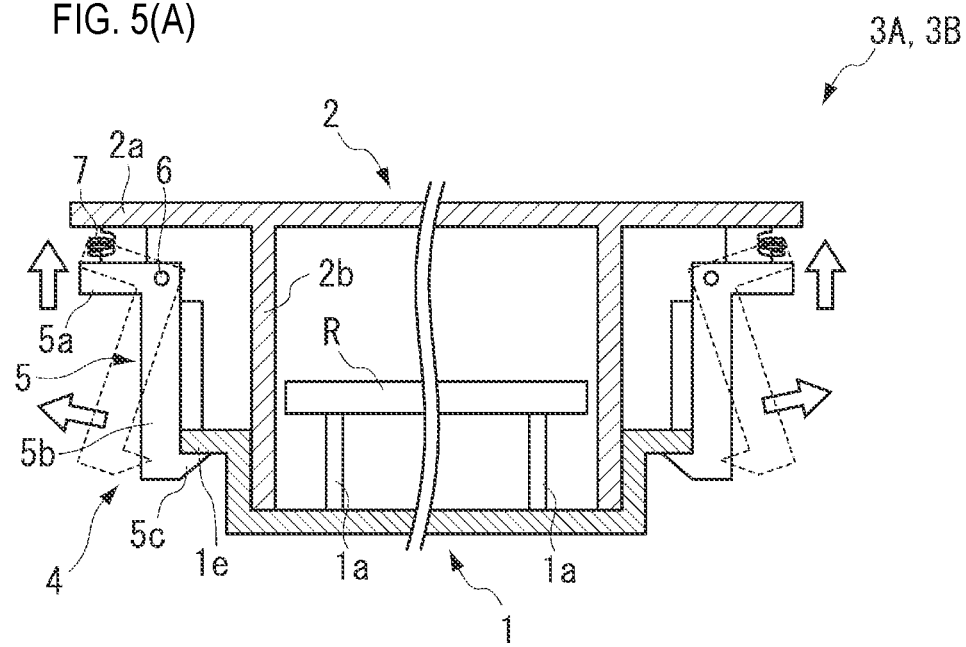
FIG. 5(A) is a diagram in which locking of the container by locking mechanisms is released.
Figure 5B:
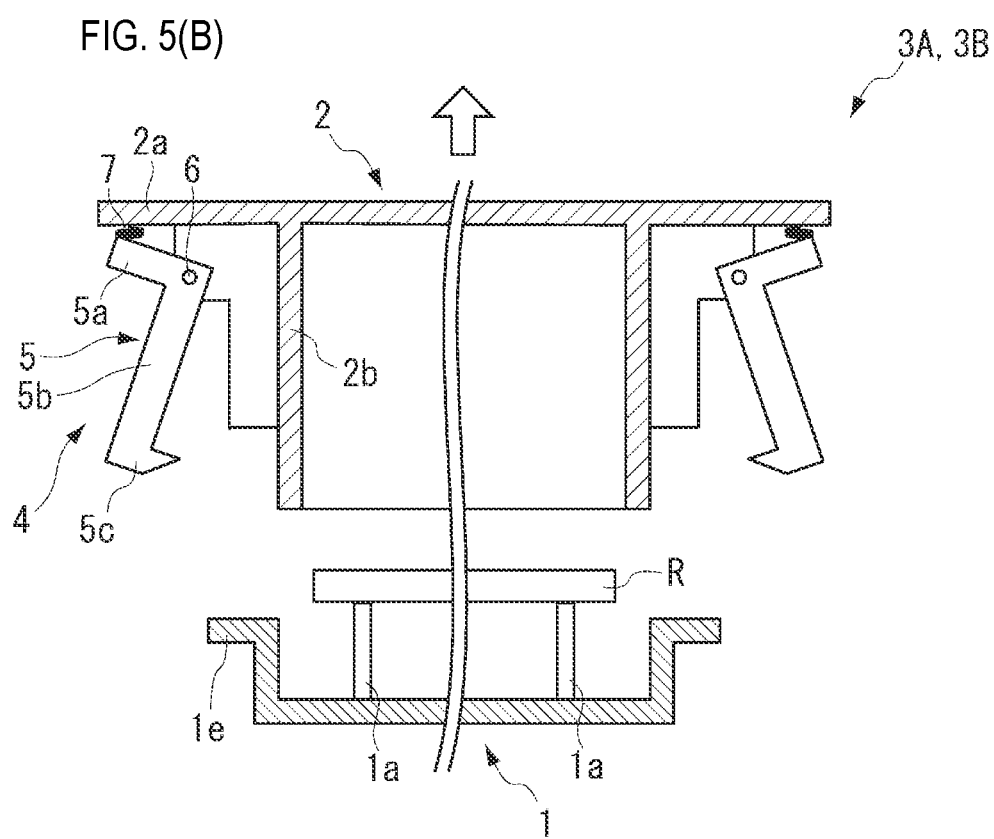
FIG. 5(B) is a diagram in which an upper lid is moved upward from a container body.

FIG. 4 is an exploded perspective view illustrating one example of the first container 3A or the second container 3B. FIG. 5(A) is a diagram in which locking of the first container 3A or the second container 3B by the corresponding locking mechanisms 4 is released, and FIG. 5(B) is a diagram in which the upper lid 2 is moved upward from the container body 1. The first container 3A and the second container 3B have the same configuration. As illustrated in FIGS. 4 and 5(A) and 5(B), the container body 1 has a rectangular plate-like shape, for example. The container body 1 has a plurality of supports 1a that support a rectangular plate-like reticle R. The supports 1a are disposed at four respective locations corresponding to the corners of the reticle R. On the respective supports 1a, positioning portions 1b are formed. The positioning portions 1b support the +Y side and the −Y side of the reticle R to prevent the reticle R from being displaced in the Y direction. On the container body 1, positioning portions 1c are formed. The positioning portions 1c support the +X side and the −X side of the reticle R to prevent the reticle R from being displaced in the X direction. A method of supporting the reticle R in the container body 1 is optional, and is not limited to the configuration described above.

The container body 1 has flanges 1d on the +X side and the −X side thereof. The flanges 1d are formed along two edges of the container body 1 opposed to each other. The flanges 1d extend along the Y direction, and are parallel to the bottom of the container body 1. Side portions are formed upright on the bottom along the Z direction, and the flanges 1d are formed from these side portions in a flanged shape extending in the X direction. These flanges 1d are arranged higher than the bottom of the container body 1. A part of each flange 1d has a locked portion 1e. The locked portion 1e is formed in an approximate center of the flange 1d in the Y direction that is the longitudinal direction thereof. On edges of each flange 1d on the +Y side and the −Y side, stepped parts 1f are formed. This stepped part 1f (stepped part 1f on the +Y side) is locked by the protrusion (not illustrated) of the corresponding holding member 17 (see FIG. 3) described above when the first container 3A or the second container 3B is disposed at the corresponding specified position P, whereby the first container 3A or the second container 3B is prevented from moving in the −Y direction.

Each upper lid 2 has the side portions 2a, a side wall 2b, and the protruding pieces 2c. The side portions 2a are formed on a top plate thereof, which is rectangular in plan view, for example, in a manner protruding therefrom each on the +X side and the −X side. The side wall 2b has a shape of a rectangular frame in plan view, and is formed along the outer periphery of the top plate. The side wall 2b is formed in a size that can be inserted between the two flanges 1d of the container body 1 (a pair of side portions formed upright on the bottom thereof). The protruding pieces 2c are formed each on the +Y side of the side portions 2a in a manner protruding outward from the side wall 2b. The thickness dimension of each protruding piece 2c is set so that the protruding piece 2c can be inserted between the corresponding lower guider 21 and the corresponding upper guider 24 described above. Ends of the protruding pieces 2c on the +Y side come into contact with the stoppers 23 of the corresponding lower guiders 21, and thus the protruding pieces 2c define the position in a direction in which the first container 3A and the second container 3B are inserted onto the respective placement platforms 10.

The first container 3A and the second container 3B each include the locking mechanism 4. The locking mechanism 4 includes a locking member 5, a shaft 6, and an elastic member 7. The locking member 5, the shaft 6, and the elastic member 7 are provided to the corresponding upper lid 2. The locking member 5 is disposed below the side portion 2a. The locking member 5 has the strip 5a, a flap 5b, and a claw 5c. The strip 5a extends in the horizontal direction along the side portion 2a, and is disposed below the side portion 2a with a predetermined spacing therebetween. The flap 5b is a portion that is bent downward from the strip 5a on the side wall 2b side. The claw 5c is formed on the lower end of the flap 5b, and is locked on the corresponding locked portion 1e of the container body 1.

The shaft 6 is disposed in the strip 5a on the side wall 2b side, and is provided to the upper lid 2 (side portion 2a) such that its axial direction corresponds to the Y-axis direction. The shaft 6 rotatably supports the locking member 5. Specifically, the locking member 5 is rotatable about the shaft 6. In other words, the strip 5a is provided rotatably about the shaft 6, and when the strip 5a rotates, the positions of the flap 5b and the claw 5c with respect to the container body 1 (locked portion 1e) change accordingly. When the strip 5a rotates upward (in the +Z-axis direction) about the shaft 6, the flap 5b and the claw 5c are separated from the container body 1. When the strip 5a rotates downward (in the −Z-axis direction) about the shaft 6, the flap 5b and the claw 5c approaches the container body 1. The elastic member 7 is disposed between the strip 5a and the side portion 2a. The elastic member 7, for which a coil spring or the like is used, for example, applies a downward elastic force to the strip 5a.

As illustrated in FIG. 5(A), when a force greater than the elastic force of the elastic member 7 is applied upward to the strip 5a, the strip 5a rotates in a direction in which the end thereof approaches the corresponding side portion 2a and, consequently, the corresponding locking member 5 rotates about the corresponding shaft 6. When the strip 5a has rotated upward with respect to the container body 1 to an extent exceeding the predetermined value, or when the distance between the upper face of the side portion 2a and the lower face of the end of the strip 5a has become smaller than the predetermined distance L (see FIG. 8), the corresponding claw 5c is separated from the container body 1 to be in a state of being disengaged from the corresponding locked portion 1e. The claws 5c are disengaged from the locked portions 1e, whereby locking of the upper lid 2 by the locking mechanisms 4 is released. In the state in which locking of the upper lid 2 by the locking mechanisms 4 has been released, each claw 5c and the corresponding locked portion 1e do not overlap each other in plan view.

As illustrated in FIG. 5(B), in the state in which the locking by the locking mechanisms 4 has been released, the upper lid 2 is separated from the container body 1 by moving the upper lid 2 upward. Consequently, the upper lid 2 is removed from the container body 1, and the corresponding one of the first container 3A and the second container 3B becomes open (in a state in which a reticle R can be retrieved therefrom or placed thereon). In the state in which the locking by the locking mechanisms 4 has been released, also by lowering the container body 1, the corresponding one of the first container 3A and the second container 3B is open. When the upper lid 2 is mounted on the container body 1 and the corresponding one of the first container 3A and the second container 3B is brought out from the corresponding placement platforms 10 (i.e., when the strips 5a are separated from the corresponding lower guiders 21), the strips 5a are pressed by the elastic members 7 to be rotated downward, the locking members 5 are accordingly rotated, the first claws 5c are accordingly brought closer to the container body 1, and thus the claws 5c are locked on the locked portions 1e again.

Figure 6:
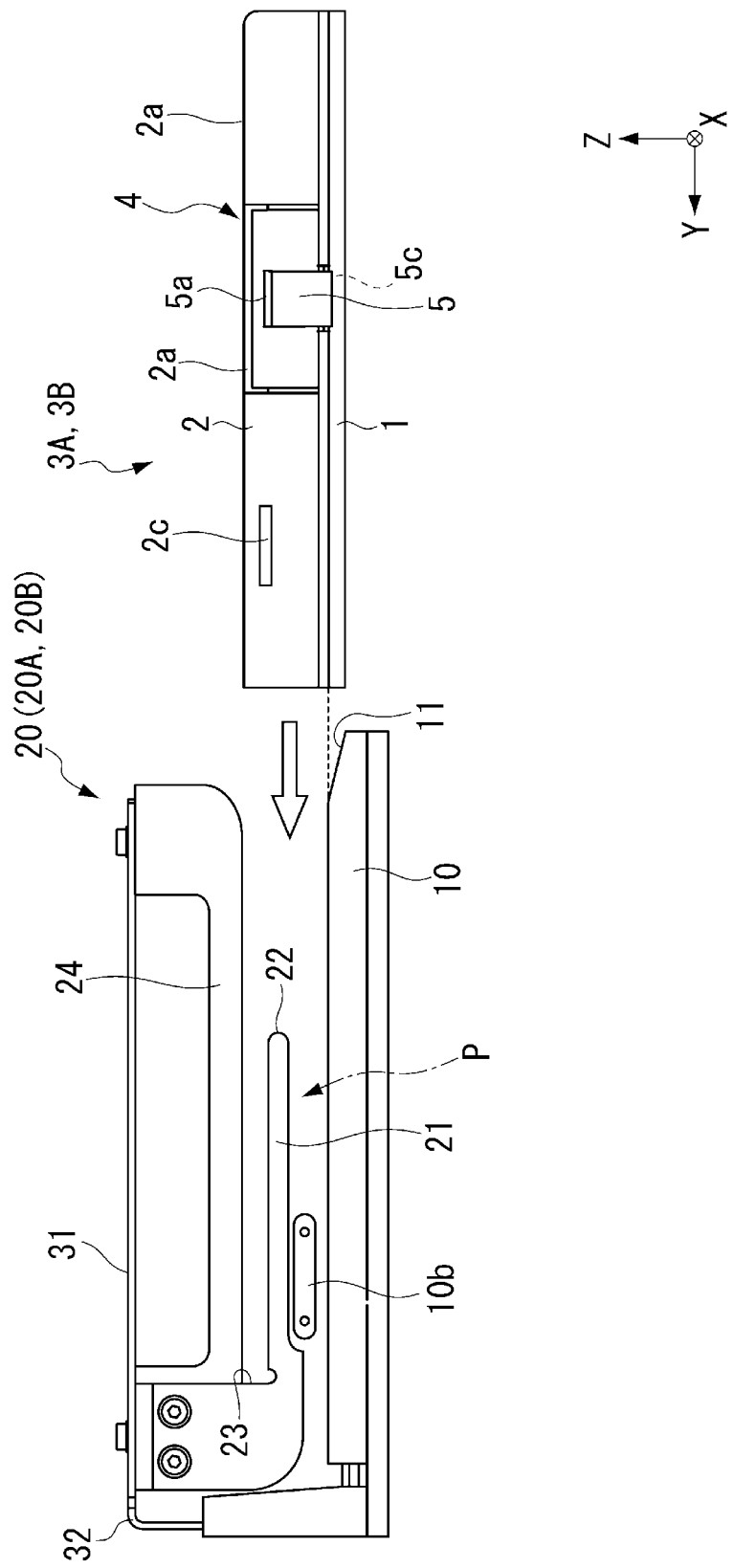
FIG. 6 is a diagram illustrating a state before the container is disposed on a placement platform.

The following describes one example of operation of opening the upper lid 2 of the first container 3A or the second container 3B that is disposed in the above-described lid opening-and-closing device 100 with reference to FIGS. 6 to 9. In FIGS. 6 to 9, the first container 3A or the second container 3B is illustrated alone as an example. FIG. 6 is a diagram illustrating a state before the first container 3A or the second container 3B is disposed onto the corresponding placement platforms 10. As illustrated in FIG. 6, on the near side (the −Y side) of the inlet of one placement platform 10, the first container 3A or the second container 3B is disposed. The first container 3A or the second container 3B may be held by a hand of an operator, for example, or may be held by a robot hand or the like.

The first container 3A or the second container 3B is disposed such that the flanges 1d thereof are positioned at the height of the placement platforms 10. From this state, the first container 3A or the second container 3B is inserted in the +Y direction to be disposed at the corresponding specified position P. When the first container 3A or the second container 3B is inserted, even if the height of the flanges 1d is lower than that of the placement platforms 10, the flanges 1d come into contact with the corresponding slopes 11 to be guided, whereby the first container 3A or the second container 3B can be inserted with the flanges 1d being placed on the placement platforms 10. When the first container 3A or the second container 3B has been inserted, the strips 5a of the locking mechanisms 4 thereof reach the curved surfaces 22 of the corresponding lower guiders 21. These strips 5a come into contact with the curved surfaces 22 to be appropriately guided onto the lower guiders 21. When the strips 5a have been guided onto the lower guiders 21, the strips 5a are rotated upward by the lower guiders 21. In other words, during the process of inserting the first container 3A or the second container 3B to the specified position P, the strips 5a have been rotated upward by the lower guider 21.

Meanwhile, when the first container 3A or the second container 3B has been inserted, the side portions 2a of the upper lid 2 thereof come into contact with the corresponding upper guiders 24 to be guided. When the first container 3A or the second container 3B is inserted, the timing at which the side portions 2a start coming into contact with the upper guiders 24 is earlier than the timing at which the strips 5a start being guided by the lower guiders 21. From the middle of the insertion, the first container 3A or the second container 3B is inserted to the specified position P with the side portions 2a being guided by the upper guiders 24 and also with the strips 5a being guided by the lower guiders 21. When the strips 5a have been rotated upward by the lower guiders 21, locking by the locking mechanisms 4 has been released. The first container 3A or the second container 3B is inserted until the protruding pieces 2c thereof come into contact with the corresponding stoppers 23. The operator can easily dispose the first container 3A or the second container 3B at the specified position P by inserting it until the first container 3A or the second container 3B stops (until it cannot be pushed further).

Figure 7:
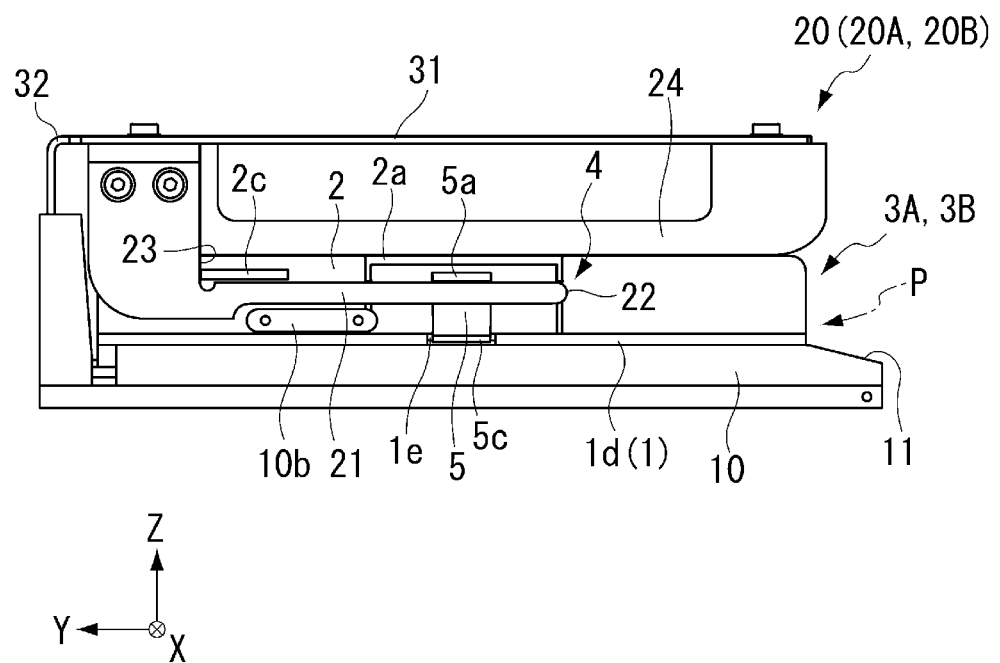
FIG. 7 is a diagram illustrating a state in which the container is disposed at a specified position of the placement platform.
Figure 8A:
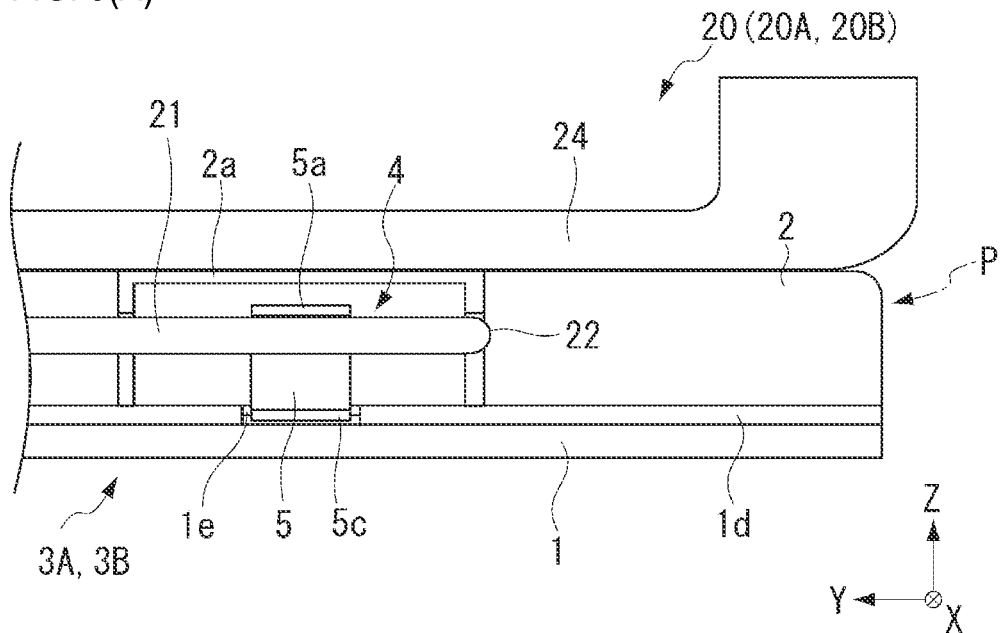
FIG. 8(A) is a diagram illustrating a main part in FIG. 7 in an enlarged manner.
Figure 8B:
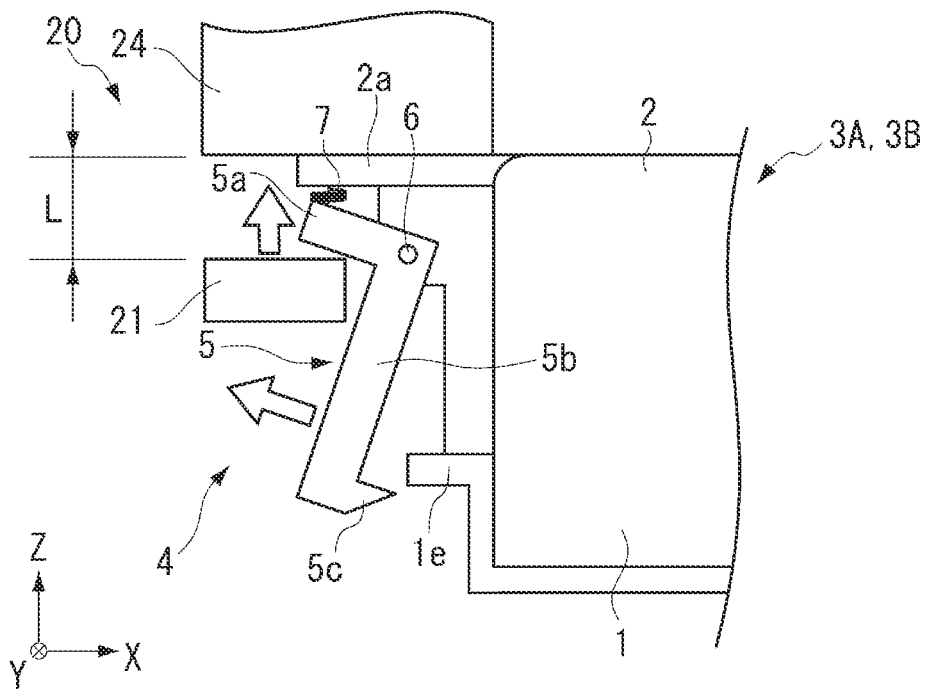
FIG. 8(B) is a diagram illustrating a state in which a locking mechanism has been released in the state illustrated in FIG. 7.

FIG. 7 is a diagram illustrating a state in which the first container 3A or the second container 3B is disposed at the specified position P. FIG. 8(A) is a diagram illustrating a main part in FIG. 7 in an enlarged manner. FIG. 8(B) is a diagram schematically illustrating one example of a locking mechanism 4 of the upper lid 2 in the state illustrated in FIG. 7. As illustrated in FIG. 7, in the state in which the first container 3A or the second container 3B is disposed at the specified position P of the corresponding placement platforms 10, each side portion 2a and the corresponding strip 5a are sandwiched between the corresponding lower guider 21 and the corresponding upper guider 24, and the corresponding upper lid 2 is supported by the corresponding holder 20 (the first holder 20A or the second holder 20B) including the lower guiders 21 and the upper guiders 24.

As illustrated in FIGS. 8(A) and (B), the strips 5a on both sides of the upper lid 2 are guided by the lower guiders 21, and the strips 5a are rotated upward with respect to the corresponding container body 1 (the first container 3A or the second container 3B) against the elastic forces of the elastic members 7. The upper faces of the side portions 2a of the upper lid 2 are in contact with the lower faces of the upper guiders 24. When the strips 5a are rotated upward, forces acting upward are applied to the upper lid 2. Because these forces are received by the upper guiders 24, the position of the upper lid 2 in the up-and-down direction is maintained. As illustrated in FIG. 8(B), the distance between the upper face of each lower guider 21 and the lower face of the corresponding upper guider 24 is set to the predetermined distance L. This predetermined distance L is a distance needed to rotate the corresponding strip 5a upward to release locking by the corresponding locking mechanism 4. In other words, the strip 5a is rotated upward by the lower guider 21 until the predetermined distance L is reached, whereby the locking by the locking mechanism 4 can be reliably released.

The side portions 2a are prevented from moving upward by the upper guiders 24. Thus, when the strips 5a are rotated upward, the upper lid 2 can be prevented from moving upward, and the strips 5a can be reliably rotated upward with respect to the container body 1. By this upward rotation of the strips 5a, the locking members 5 rotate about the shafts 6, and the claws 5c are disengaged from the locked portions 1e of the container body 1. Consequently, locking by the locking mechanisms 4 is released, and the upper lid 2 can be moved upward from the container body 1. As long as the first container 3A or the second container 3B is disposed at the specified position P, the state in which locking by the locking mechanisms 4 is released is maintained.

Figure 9:
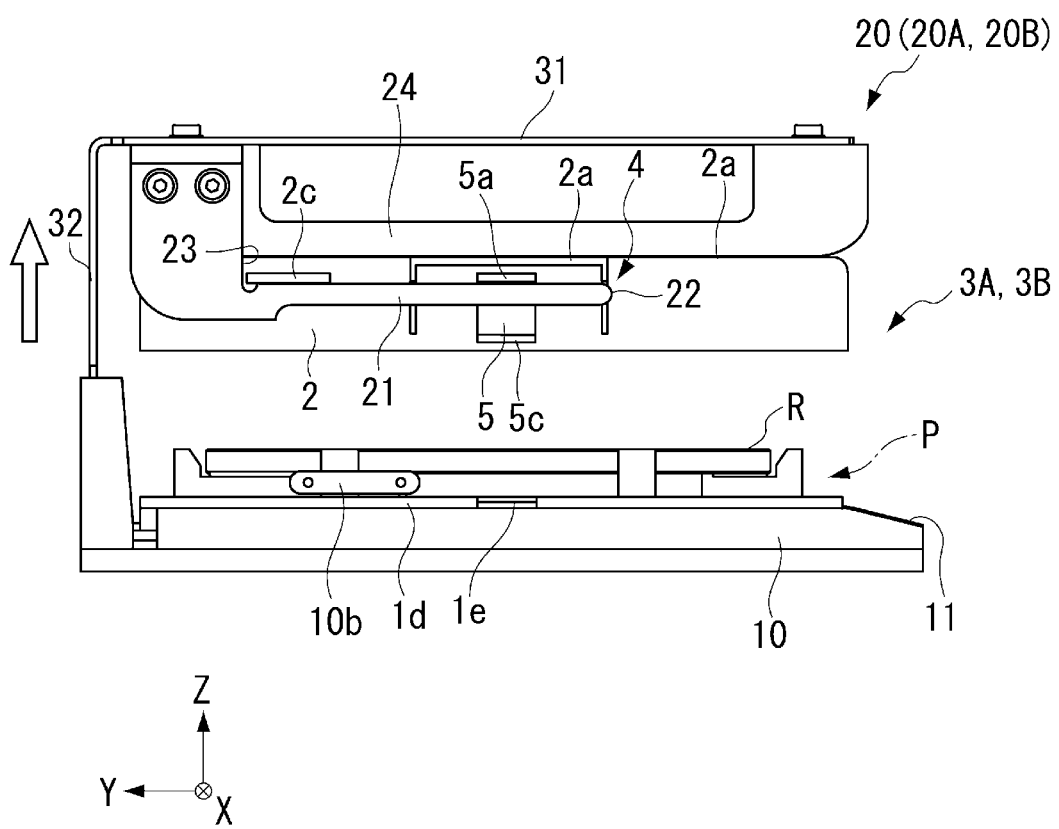
FIG. 9 is a diagram illustrating one example of operation of moving the upper lid upward.

FIG. 9 is a diagram illustrating one example of operation of opening the upper lid 2. The holder 20 (the first holder 20A or the second holder 20B) is raised by the corresponding raising/lowering driver 40 (the first raising/lowering driver 40A, the second raising/lowering driver 40B), whereby the lower guiders 21 and the upper guiders 24 are raised as illustrated in FIG. 9. Because the side portions 2a on both sides of the upper lid 2 and the strips 5a are sandwiched between the lower guiders 21 and the upper guiders 24 to be held, when the lower guiders 21 and the upper guiders 24 ascend, the upper lid 2 accordingly ascends with respect to the container body 1. When the upper lid 2 ascends, the upper side of the container body 1 becomes open, and a reticle R can be retrieved from or placed into the container body 1.

For the first container 3A, as described above, the first holder 20A is raised by extending the cylinder rods 42A of the first raising/lowering driver 40A with respect to the cylinder body 41A. In contrast, for the second container 3B, the second holder 20B is raised by retracting the cylinder rods 42B of the second raising/lowering driver 40B with respect to the cylinder body 41B.

Figure 10:
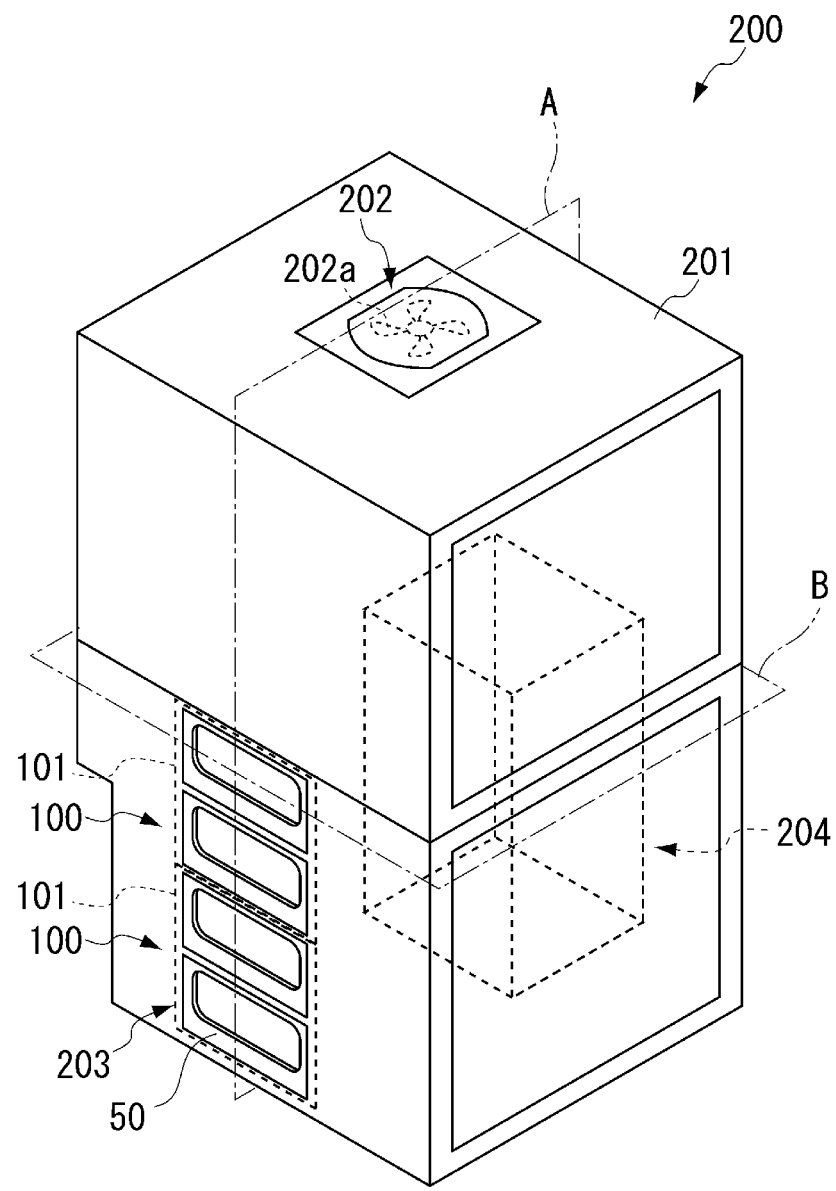
FIG. 10 is a perspective view illustrating one example of a reticle pod in which lid opening-and-closing devices are mounted.
Figure 11:
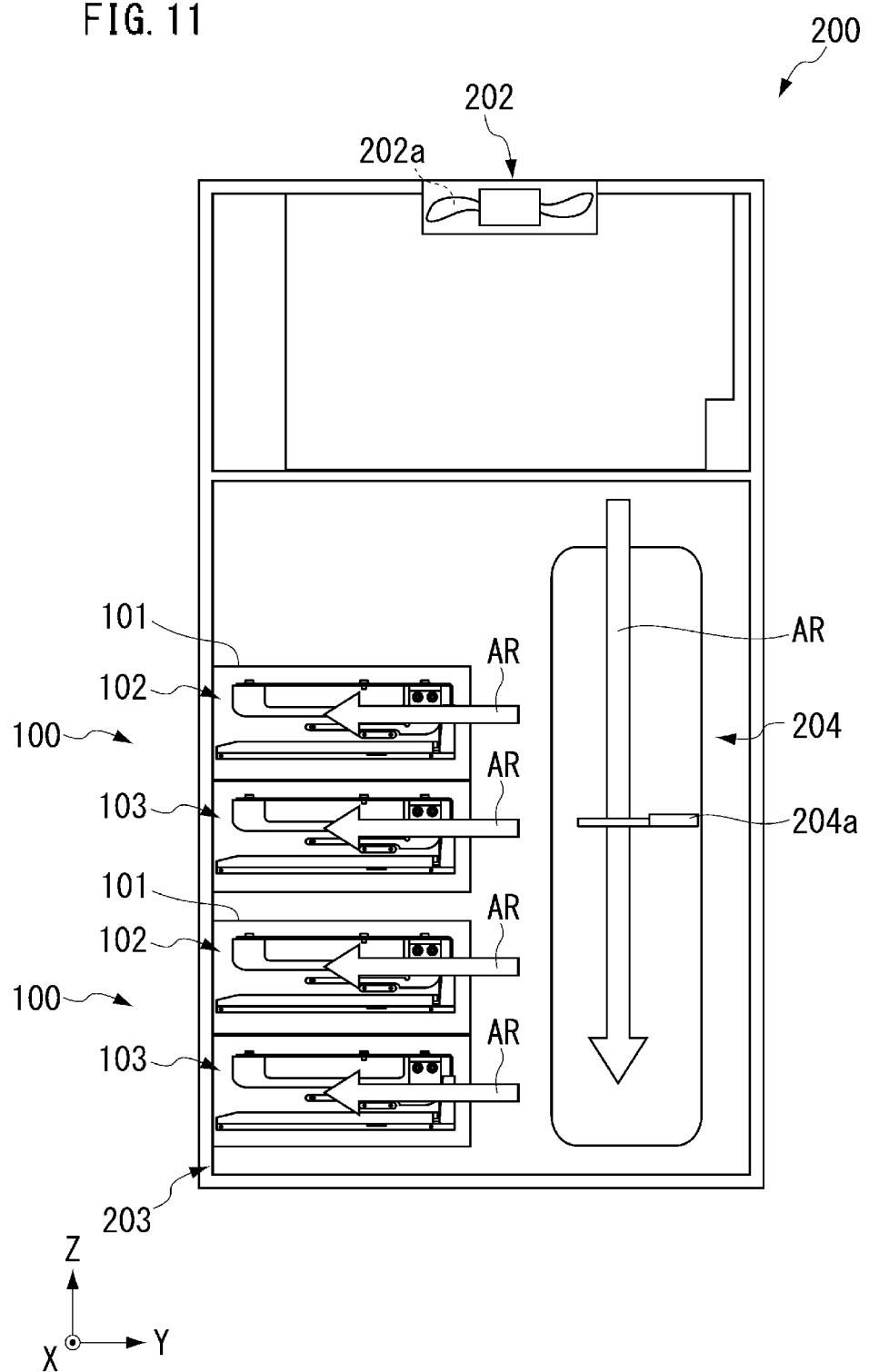
FIG. 11 is a sectional view taken along plane A in FIG. 10.
Figure 12:
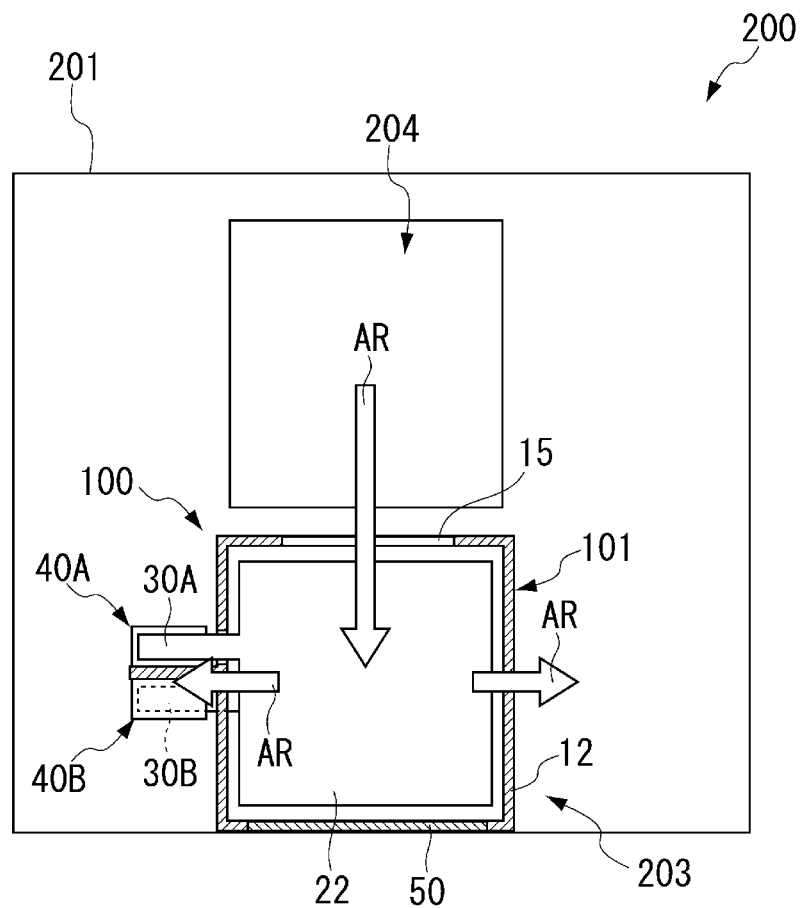
FIG. 12 is a sectional view taken along plane B in FIG. 10.
Figure 12:
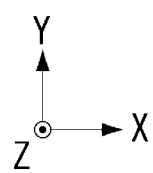

FIG. 10 is a perspective view illustrating one example of a reticle loading-and-unloading device 200 in which lid opening-and-closing devices 100 described above are mounted. FIG. 11 is a sectional view taken along plane A in FIG. 10. FIG. 12 is a sectional view taken along plane B in FIG. 10. The reticle loading-and-unloading device 200 is, for example, disposed adjacent to a reticle storage device, a photolithography device or the like, and conveys a reticle R between the first container 3A or the like disposed in each lid opening-and-closing device 100 and a storage area for the reticle R or a treatment area using the reticle R. As illustrated in FIGS. 10 and 11, the reticle loading-and-unloading device 200 includes a housing 201, fan filter unit 202 (FFU 202), a lid opening-and-closing device installation 203, and a reticle conveyor 204. The housing 201 accommodates the FFU 202, the lid opening-and-closing device installation 203, and the reticle conveyor 204.

The FFU 202 is disposed in the housing 201 at the top thereof. The FFU 202 includes a fan 202a and a filter (not illustrated). The FFU 202 suctions air from outside the housing 201 by rotation of the fan 202a, removes particles, moisture and the like with the filter (not illustrated), and feeds the air into the housing 201. This air (clean dry air) AR fed from the FFU 202 forms a downflow in the housing 201.

The lid opening-and-closing device installation 203 is set in the housing 201 at the bottom of the FFU 202. In the lid opening-and-closing device installation 203, the lid opening-and-closing devices 100 described above are installed. In this example, in the lid opening-and-closing device installation 203, two lid opening-and-closing devices 100 are installed one above the other, but this disclosure is not limited to this example. For example, one lid opening-and-closing device 100 may be installed in the lid opening-and-closing device installation 203, or three or more lid opening-and-closing devices 100 may be installed therein. In the example in which two lid opening-and-closing devices 100 are installed in the lid opening-and-closing device installation 203, containers (first containers 3A or second containers 3B) the number of which is four in total can be inserted. Each lid opening-and-closing device 100 is installed with the insertion side of the first container 3A or the second container 3B facing a wall of the housing 201 on the −Y side.

The reticle conveyor 204 is provided in the housing 201 on the +Y side of the lid opening-and-closing devices 100. The reticle conveyor 204 retrieves or places a reticle R from or into the first container 3A or the second container 3B disposed in each lid opening-and-closing device 100. The reticle conveyor 204 conveys the reticle R to or from the reticle storage device, the photolithography device or the like adjacent to the reticle loading-and-unloading device 200. The reticle conveyor 204 includes an arm 204a that places and supports the reticle R.

The arm 204a is raised and lowered by a raising/lowering device (not illustrated) and, after stopping at the height of a first container 3A or a second container 3B targeted, moves in the −Y direction to below a reticle R through the corresponding opening 16 (see FIG. 2) of the casing 101 of the corresponding lid opening-and-closing device 100, and subsequently ascends to pick up the reticle R from the first container 3A or the second container 3B, thereby being able to convey it to another place.

The air AR that is a downflow generated by the FFU 202 flows downward in the reticle conveyor 204 as illustrated in FIG. 11, a part thereof flows into the casings 101 from through the openings 16 of the casings 101 of the lid opening-and-closing devices 100. Furthermore, as illustrated in FIG. 12, the air AR that has flowed into each lid opening-and-closing device 100 flows in the +X direction and the −X direction to be discharged outside the corresponding casing 101. In other words, the casing 101 are disposed in an environment where a flow of the air AR is present, one side of the casing 101 (a side on which the first raising/lowering driver 40A and the second raising/lowering driver 40B are disposed) is downstream of the flow of the air AR with respect to the casing 101.

The air AR that has flowed into the casing 101 is greater in flow volume than the air AR that is discharged outside the casing 101 from the first notch 12A and the second notch 12B and the slits 13 (see FIG. 1) formed in the side wall 12 of the casing 101 on the −X side and is also discharged outside the casing 101 from the slits 13 formed in the side wall 12 of the casing 101 on the +X side. Although not illustrated, a part of the air AR inside the casing 101 is discharged outside the casing 101 also from, for example, gaps between the casing 101 and the shutters 50.

By this flow of the air AR, the environment around the first container 3A and the second container 3B inside the casing 101 is kept clean. Air in an area where the first raising/lowering driver 40A and the second raising/lowering driver 40B that act as sources of particles (area on the one side of the casing 101) can be prevented from entering the casing 101. Furthermore, the first raising/lowering driver 40A and the second raising/lowering driver 40B are disposed collectively on the one side of the casing 101, and the first notch 12A and the second notch 12B are formed in the side wall 12 on this one side. Thus, the air AR is discharged outside the casing 101 on the one side, whereby particles generated from the first raising/lowering driver 40A and the second raising/lowering driver 40B can be reliably and efficiently prevented from entering the casing 101. The air AR discharged outside the casing 101 is discharged outside from a vent hole (not illustrated) or the like formed in the housing 201.

As described above, with the lid opening-and-closing device 100, because the first raising/lowering driver 40A and the second raising/lowering driver 40B respectively hold the first holder 20A and the second holder 20B in a cantilevered manner and are disposed outside the casing 101 collectively on the one side with respect to the casing 101, the first raising/lowering driver 40A and the second raising/lowering driver 40B can be disposed compactly, and upsizing of the device can be suppressed. Furthermore, because the first raising/lowering driver 40A and the second raising/lowering driver 40B that act as sources of particles are disposed collectively on the one side with respect to the casing 101, a clean environment around the first container 3A and the second container 3B can be easily maintained by preventing gas, in an area where the first raising/lowering driver 40A and the second raising/lowering driver 40B are disposed, from entering the casing 101.

Although the example has been described above, our devices are not limited to the above description, and various modifications may be made within the scope of the appended claims. For example, in the above configuration, an example of a configuration has been described in which the cylinder bodies 41A, 41B are attached to one attachment 14. However, our devices are not limited to this configuration. For example, the cylinder bodies 41A, 41B may be attached directly to the corresponding side wall 12, or may be attached to two respective attachments 14 provided to the casing 101.

In the above configuration, an example of a configuration has been described in which the cylinder bodies 41A, 41B are disposed in a manner overlapping each other at least partially when viewed in the horizontal direction. However, our devices are not limited to this configuration. For example, the cylinder bodies 41A, 41B may be disposed apart from each other in the up-and-down direction when viewed in the horizontal direction.

One or more requirements described in the above example may be omitted. Requirements described in the above example may be combined appropriately. Japanese Patent Application No. 2019-030399 that is a Japanese patent application and all literatures cited in the above example may be used as a part of the description in this description.

The invention claimed is:

1. A lid opening-and-closing device comprising:
   a casing;
   a first lid opening-and-closing mechanism that opens and closes an upper lid of a first container disposed in the casing; and
   a second lid opening-and-closing mechanism that opens and closes an upper lid of a second container disposed in parallel below the first container in the casing, wherein
   the first lid opening-and-closing mechanism includes: a first holder that holds the upper lid of the first container; a first protrusion provided to protrude from the first holder toward one side direction with respect to the first holder and extends to outside of the casing; and a first raising/lowering driver that raises and lowers the first holder in a cantilevered manner with the first protrusion interposed therebetween,
   the second lid opening-and-closing mechanism includes: a second holder that holds the upper lid of the second container; a second protrusion provided to protrude from the second holder toward said one side direction and extends to the outside of the casing; and a second raising/lowering driver that raises and lowers the second holder in a cantilevered manner with the second protrusion interposed therebetween, and
   the first raising/lowering driver and the second raising/lowering driver are located outside the casing and in said one side direction with respect to the casing.

2. The lid opening-and-closing device according to claim 1, wherein the first raising/lowering driver and the second raising/lowering driver are disposed adjacent to each other.

3. The lid opening-and-closing device according to claim 1, wherein
   the casing is disposed in an environment where an air flow is present, and
   said one side direction is downstream of the air flow with respect to the casing.

4. The lid opening-and-closing device according to claim 1, wherein
   each of the first raising/lowering driver and the second raising/lowering driver is a fluid-pressure cylinder including a cylinder body and a cylinder rod,
   the first raising/lowering driver is disposed such that the corresponding cylinder rod protrudes upward,
   the second raising/lowering driver is disposed such that the corresponding cylinder rod protrudes downward, and
   the cylinder body of the first raising/lowering driver and the cylinder body of the second raising/lowering driver are disposed to overlap each other at least partially when viewed in a horizontal direction.

5. The lid opening-and-closing device according to claim 1, wherein
   an attachment is provided to protrude from the casing toward said one side direction,
   the first raising/lowering driver is attached to one surface of the attachment, and
   the second raising/lowering driver is attached to another surface of the attachment that is opposite to the one surface.

* * * * *